United States Patent [19]
Harms et al.

(10) Patent No.: US 7,088,160 B2
(45) Date of Patent: Aug. 8, 2006

(54) CIRCUIT ARRANGEMENT FOR REGULATING A PARAMETER OF AN ELECTRICAL SIGNAL

(75) Inventors: Torsten Harms, Kempen (DE); Harald Doppke, Mülheim an der Ruhr (DE); Detlev Theil, Stockholm (SE); Stefan van Waasen, Sollentuna (SE)

(73) Assignee: Infineon Technologies AG, Munich (DE)

( * ) Notice: Subject to any disclaimer, the term of this patent is extended or adjusted under 35 U.S.C. 154(b) by 12 days.

(21) Appl. No.: 10/897,179

(22) Filed: Jul. 22, 2004

(65) Prior Publication Data

US 2005/0225370 A1    Oct. 13, 2005

Related U.S. Application Data

(60) Provisional application No. 60/561,174, filed on Apr. 8, 2004.

(51) Int. Cl.
*H03K 3/017* (2006.01)

(52) U.S. Cl. ...................... 327/175; 327/538

(58) Field of Classification Search ............ None
See application file for complete search history.

(56) References Cited

U.S. PATENT DOCUMENTS

| | | | | |
|---|---|---|---|---|
| 3,879,676 A | * | 4/1975 | Schulz et al. | 331/10 |
| 4,044,296 A | * | 8/1977 | Dhyanchand et al. | 322/25 |
| 4,347,976 A | * | 9/1982 | Jakobsen | 236/68 B |
| 5,373,225 A | * | 12/1994 | Poletto et al. | 323/282 |
| 6,504,409 B1 | * | 1/2003 | Laletin | 327/175 |
| 6,683,441 B1 | * | 1/2004 | Schiff et al. | 323/222 |

\* cited by examiner

*Primary Examiner*—Timothy P. Callahan
*Assistant Examiner*—Cassandra Cox
(74) *Attorney, Agent, or Firm*—Eschweller & Associates, LLC

(57) ABSTRACT

A circuit arrangement for regulating a parameter (e.g., duty cycle) of an electrical signal, generated by a circuit component. The regulating device includes a first integrator, which is supplied with the output signal from the circuit component, and a second integrator, which is supplied with the output signal from the first integrator. The second integrator has an operational amplifier having an inverting input, a noninverting input and an output, and the output is fed back to the inverting input via a feedback path. The inverting input receives the output signal from the first integrator. The noninverting input receives a reference signal. The output of the operational amplifier is fed back to the inverting input via a series circuit including a capacitor and a resistor. The output of the second operational amplifier provides an output signal from the regulating device, which is supplied to the circuit component as a controlled variable.

17 Claims, 2 Drawing Sheets

CIRCUIT ARRANGEMENT FOR REGULATING A PARAMETER OF AN ELECTRICAL SIGNAL

RELATED APPLICATIONS

This application claims priority of U.S. Provisional Patent Application 60/561,174, entitled "Circuit Arrangement For Regulating A Parameter Of An Electrical Signal" filed Apr. 8, 2004.

FIELD OF THE INVENTION

The invention relates to a circuit arrangement for regulating a parameter of an electrical signal. In particular, the invention relates to a circuit arrangement for regulating the duty cycle of an electrical signal. It is preferably used for regulating the duty cycle of dynamic interface signals in digital communication systems.

BACKGROUND TO THE INVENTION

A "duty cycle" in digital communication systems refers to the pulse/pause or on/off ratio in an electrical signal. In particular, the duty cycle indicates the percentage in which there is a high level in a signal. Ideally, the duty cycle is 50% or 0.5.

The duty cycle is an important characteristic quantity for dynamic interface signals in digital communication systems. Dynamic interface signals are, in particular, input and output signals for digital communication components. For the duty cycle, there are generally very restrictive specifications in order to ensure that individual components work in an overall system. The greater the number of components, the more it is necessary to restrict the specification. Observing this specification under all constraints, such as temperature, supply voltage and manufacturing tolerances, is often a problem.

When there are a large number of system components in a signal chain, it is known practice to incorporate, as a rule, a retiming stage (clock recovery) in order to regenerate the signal again in respect of its requirements. In this context, the signal is refreshed in terms of jitter and duty cycle, in particular. However, a drawback of such retiming stages is that they require considerable complexity in terms of additional system components.

There is generally a need for circuit arrangements which allow simple and effective regulation of a parameter of an electrical signal. In particular, there is a need for circuit arrangements for regulating the duty cycle of an electrical signal.

SUMMARY OF THE INVENTION

The present invention provides a circuit arrangement which firstly has a circuit component which outputs an electrical output signal having an electrical parameter which is to be regulated and secondly has a regulating device. The regulating device comprises a first integrator, which is supplied with the output signal from the circuit component, and a second integrator, which is supplied with the output signal from the first integrator. In this case, the second integrator has an operational amplifier having an inverting input, a noninverting input and an output. The output is fed back to the inverting input via a feedback path. The inverting input has the output signal from the first integrator applied to it. The noninverting input has a reference signal representing a nominal value applied to it. The output of the operational amplifier is fed back to the inverting input in the feedback path via a series circuit comprising a capacitor and a resistor. The output of the first operational amplifier provides an output signal from the regulating device, which is supplied to the circuit component as a controlled variable.

The inventive circuit arrangement is based on the concept of providing a two-stage integrator having a first integrator and a second integrator, connected in series therewith, as a feedback device. In this case, the second integrator is formed by an operational amplifier. The operational amplifier's feedback path incorporates a series circuit comprising a capacitor and a nonreactive resistor. This ensures that the controlled variable fed back to the circuit component has a suitable phase rotation and, in particular, is not fed back with a phase rotation of 180°. In this case, the series circuit comprising a capacitor and a resistor in the operational amplifier's feedback path acts as pole zero compensation.

The two-stage integrator takes its input information directly from the data output stage of the circuit component. The parameter to be regulated is set using the nominal value which is applied to the noninverting input of the operational amplifier. In this case, the parameter to be regulated is preferably the duty cycle of the output signal. The nominal value applied to the noninverting input of the operational amplifier can be used to set the duty cycle to exactly 50:50 or else to a different value.

The inventive solution provides direct regulation of the output signal via the entire relevant signal path. Thus, the controlled variable from the regulating device is supplied to the circuit component, where it controls circuit means to which an input signal is applied. There is thus regulation from the input to the output. This means that inaccuracies in the input signal can also be corrected directly, and input signals having a poor duty cycle, for example, can also be reconstructed. Any inaccuracies in subsequent elements are avoided. In this case, it does not matter whether the output signal is in the form of a voltage signal or a current signal. In addition, a simple way of setting the duty cycle as desired is provided, i.e. including to values other than 50%.

The first integrator is preferably in the form of a low pass filter. The reference signal applied to the noninverting input of the operational amplifier is preferably provided by a resistive voltage divider.

The circuit component preferably has a differential stage which produces a digital output signal whose duty cycle is regulated by the circuit arrangement. The differential stage preferably identifies the following components: a first comparator, which has input signals applied to it; a first current source for controlling the current through the first comparator; a second comparator, which is of complementary design to the first comparator and has the same input signals applied to it; a second current source for controlling the current through the second comparator; a device which takes the currents in the two comparators and produces a voltage signal of fluctuating level; a regenerator device which converts the fluctuating voltage signal into a digital output signal and supplies it to an output; and a control device which takes the output signal from the regulating device as a basis for producing two control signals, one of which is supplied to the first current source and one of which is supplied to the second current source. In this case, the first current source and the second current source take the respectively applied control signal as a basis for regulating the current through the first comparator and the second comparator such that the duty cycle of the output signal from the circuit component is set to a stipulated value.

This refinement is based on the concept of regulating the current sources for the two comparators such that the output signal has the desired duty cycle, and of using the output signal itself as controlled variable in this case. The currents through the two comparators can be used to shift the changeover points of the signal in question very well over wide ranges. It is also possible to set the speed of the comparators and hence the rise and fall times on the basis of the available current. In this context, provision is made for the two current sources to be regulated by the control device preferably in opposite senses: to the extent to which the current through one current source increases, the current through the other current source decreases. To a certain extent, a constant current is split over the two current sources for the two comparators on a basis of the regulation.

The first comparator preferably comprises a first input differential amplifier having two transistors, and the second comparator comprises a second input differential amplifier having two transistors. In this arrangement, the first input differential amplifier preferably has two n-channel FET transistors, and the first current source is arranged between ground and the source connections of the transistors in the first input differential amplifier. The second input differential amplifier preferably has two p-channel FET transistors, with the second current source being arranged between an operating voltage and the source connections of the transistors in the second input differential amplifier.

In another preferred refinement, the device which takes the currents in the two input differential amplifiers and produces a voltage signal of fluctuating level is formed by two current mirror circuits which respectively have a current mirror comprising a first current mirror transistor and a second current mirror transistor. In this arrangement, a transistor in one current mirror and a transistor in the other current mirror are connected to one another. The voltage signal of fluctuating level is tapped off between these two transistors.

The control device for the differential stage preferably has two current-carrying arms, with the current through one arm being stipulated by a reference signal and the current through the other arm being stipulated by the controlled variable from the regulating device, and with the flow of current through the respective arm being taken as a basis for supplying a respective control signal to the first current source and to the second current source. In particular, the control signal is a respective control voltage which sets the current through the respective comparator current source.

In one preferred refinement, each current-carrying arm of the control device has an n-channel FET transistor and a p-channel FET transistor which are connected in series. One of the transistors in each arm is preferably coupled to one of the current sources for the comparators by means of at least one current mirror. In this way, a control signal is provided on the respective current source.

In addition, the circuit component preferably has an output amplifier which is connected downstream of the differential stage and whose output signal is supplied to the first integrator in the regulating device.

BRIEF DESCRIPTION OF THE DRAWINGS

The invention is explained in more detail below using an exemplary embodiment with reference to the figures, in which.

DESCRIPTION OF A PLURALITY OF PREFERRED EMBODIMENTS

Figure 1:
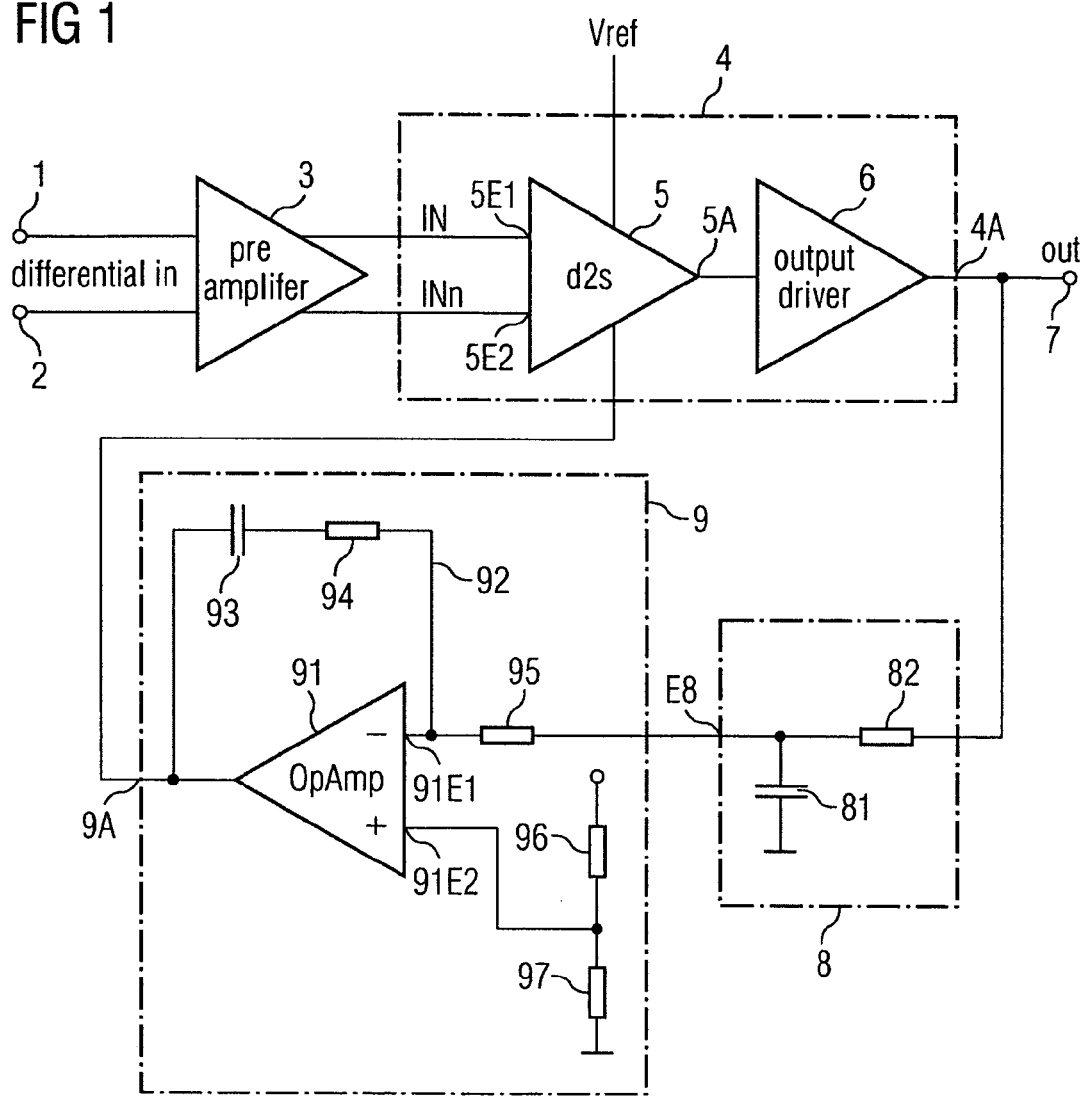
FIG. 1 shows a control loop for regulating the duty cycle of an electrical signal, having a differential stage and a two-stage integrator which is used as a regulating device.

FIG. 1 shows a circuit arrangement having a preamplifier 3, a differential stage 5 and an output driver 6. The differential stage 5 has two inputs 5E1, 5E2 and an output 5A. A differential input signal is applied to two input terminals 1, 2 on the preamplifier 3. The differential output signal IN, INn from the preamplifier 3 is supplied to the inputs 5E1, 5E2 of the differential stage 5. The differential stage 5 performs "differential-to-single" conversion, i.e. the differential input signal IN, INn is converted into a single-ended signal. In this case, signal regeneration takes place simultaneously. The output 5A of the differential stage 5 produces a digital output signal which is supplied to the output driver 6. The output signal from the output driver 6 is provided on an output terminal 7.

The differential input signal applied to the input terminals 1, 2 or the signal which is supplied to the two inputs 5E1, 5E2 of the differential stage 5 comprises a sequence of high and low voltage signals, with the input signal possibly being of poor quality and not having the desired duty cycle, in particular. By controlling the current sources for two comparators of complementary design in the differential stage 5, the rising and falling edges of the input signal are accelerated or decelerated such that a downstream regenerator can be used to set the pulse length by means of the shift in the changeover point over time. The output 5A of the differential stage then produces a regenerated, digitally useful signal having the desired duty cycle. This is described in detail with reference to FIG. 2.

The duty cycle is set by means of regulation. In this case, the variable to be regulated is the duty cycle of the electrical signal at the output 7 of the circuit. In this context, the differential stage 5 and the output driver 6 may be regarded as a control element 4 in a control loop whose output 4A provides an actual value. A regulating device which detects the actual value, compares it with a nominal value and provides a controlled variable for the control element 4 taking into account the difference between the actual value and the nominal value is provided by two integrators 8, 9 arranged one behind the other. The output signal which is output at an output 9A on the second integrator 9 is supplied as controlled variable to the differential stage 5.

The first integrator 8 is formed by a low pass filter which comprises a capacitor 81 and a nonreactive resistor 82. The second integrator is formed by an operational amplifier 91. The operational amplifier 91 has an inverting input 91E1 and a non-inverting input 91E2. Its output is connected to the inverting input 91E1 via a feedback path 92. The feedback path has a series circuit comprising a capacitor 93 and a nonreactive resistor 94.

The non-inverting input 91E2 has a reference signal applied to it which is provided by a resistive voltage divider containing two resistors, 96, 97. The inverting input 91E1 has the output signal from the first integrator 8 applied to it, which is supplied to the noninverting input 91E1 via a further nonreactive resistor 95.

The way in which the regulating device 8, 9 works is as follows:

The output 7 produces a digital signal which fluctuates to and from between the maximum operating voltage VDD and the ground voltage. The digital output signal has a particular duty cycle. This duty cycle is preferably 50%, and the regulation which is to be performed is intended to set a duty cycle of 50%. Alternatively, another value may also be set.

The first integrator 8 integrates the output signal, said output signal fluctuating around a center value of VDD/2 at the signal clock rate. The output signal provided at the output E8 of the first integrator 8 is the voltage which is present across the capacitor 81. The first integrator provides a high level of attenuation for the signal produced at the output 7 of the circuit.

This highly attenuated signal is now supplied to the second integrator 9, where it undergoes further integration. The output 9A of the second integrator produces an even more highly attenuated signal, which now fluctuates only slightly at the signal clock rate. Ideally, the output signal would be constant.

The output signal from the first integrator 8 is supplied to the inverting input 91E1 of the operational amplifier via the resistor 95. A reference signal is provided at the non-inverting input 91E2 via the resistive voltage divider 96, 97. In this case, for a duty cycle of 50% needing to be set, this reference value is VDD/2, that is to say half the operating voltage. The operational amplifier 91 compares the signals applied to the two inputs 91E1, 91E2 and attempts to regulate the difference to zero. That is to say, the output 9A provides a voltage signal which brings about regulation to the extent that the signal which is applied to the inverting input 91E1 is of the same magnitude as the reference signal applied to the noninverting input 91E2. The voltage signal produced at the output 9A is the controlled variable from the regulating device for the control element 4.

The following should now also be noted:

The individual elements in a control loop have a particular transfer behavior which is defined by the transfer function and the phase rotation. These variables are usually shown as a function of frequency in a "bode diagram", which is known to the person skilled in the art. The controlled variable provided by the regulating device 8, 9 needs to be such that it opposes the discrepancy between actual value and nominal value (the nominal value being provided by the voltage divider 96, 97). However, the elements in the control loop can dynamically delay the controlled variable such that there is a phase rotation which increases the magnitude of the discrepancy further instead of opposing it. The entire circuit then starts to oscillate. To prevent this in the present case, the controlled variable which is output at the output 9A must not have a phase rotation of 180° in relation to the input signal for the differential stage 5. Instead, the phase rotation should be no more than 150°. However, an ordinary integrator is able to rotate the phase through −90° in each case, which means that two ordinary integrators can achieve a phase rotation of no more than −180° or 180°. This phase rotation needs to be prevented in the present case, however.

To prevent this, a resistor 94 is added in series in the feedback path 92 of the operational amplifier 91 for the capacitor 93 which is customary in integrators. This provides an additional phase rotation which reduces the total phase rotation for the two integrators 8, 9 and prevents it from totaling 180°.

In this context, it is significant that the operational amplifier 91 continues to work as an amplifier despite the addition of the resistor 94. The only difference over conventional integrators, where the feedback path has just one capacitor, is in its phase.

In the present case, there is an integrator with pole zero compensation (lag-lead compensation). The series circuit comprising the capacitor 93 and the resistor 94, which is incorporated in the feedback path 92, compensates for a pole point.

This is explained further as follows:

The transfer function G(s) of the two-element integrator 8, 9 is provided by the ratio of the output voltage at the node 7 to the input voltage at the node 9A. The following formula applies:

$$G(s) = \frac{1 + s \times R(94) \times C(93)}{s \times C(93) \times R(95) \times \left\{ \frac{R(82)}{R(95)} + s \times C(81) \times R(82) + 1 \right\}}$$

In this case, the number in round brackets indicates the respective corresponding reference numeral in FIG. 1. By way of example, R(94) is the resistance value of the resistor 94. "s" stands for jω, where ω is equal to the loop frequency.

The first pole point (=zero point in the denominator) is s=0 and cannot be combated, i.e. there is a phase rotation of 90° from just very small frequencies onward.

The addition of the resistor R(94) results in a term which can become zero (zero point) in the numerator. In the denominator, the term in curly brackets gives a second pole point (besides the first at s=0).

If the term in the numerator and the term in curly brackets in the denominator compensate for one another, they can be cancelled, and just one pole at s=0 is left arithmetically. There is pole zero compensation (lag-lead compensation). The pole zero compensation is achieved by adding the resistor 94 to the feedback path of the operational amplifier 91.

Figure 2:
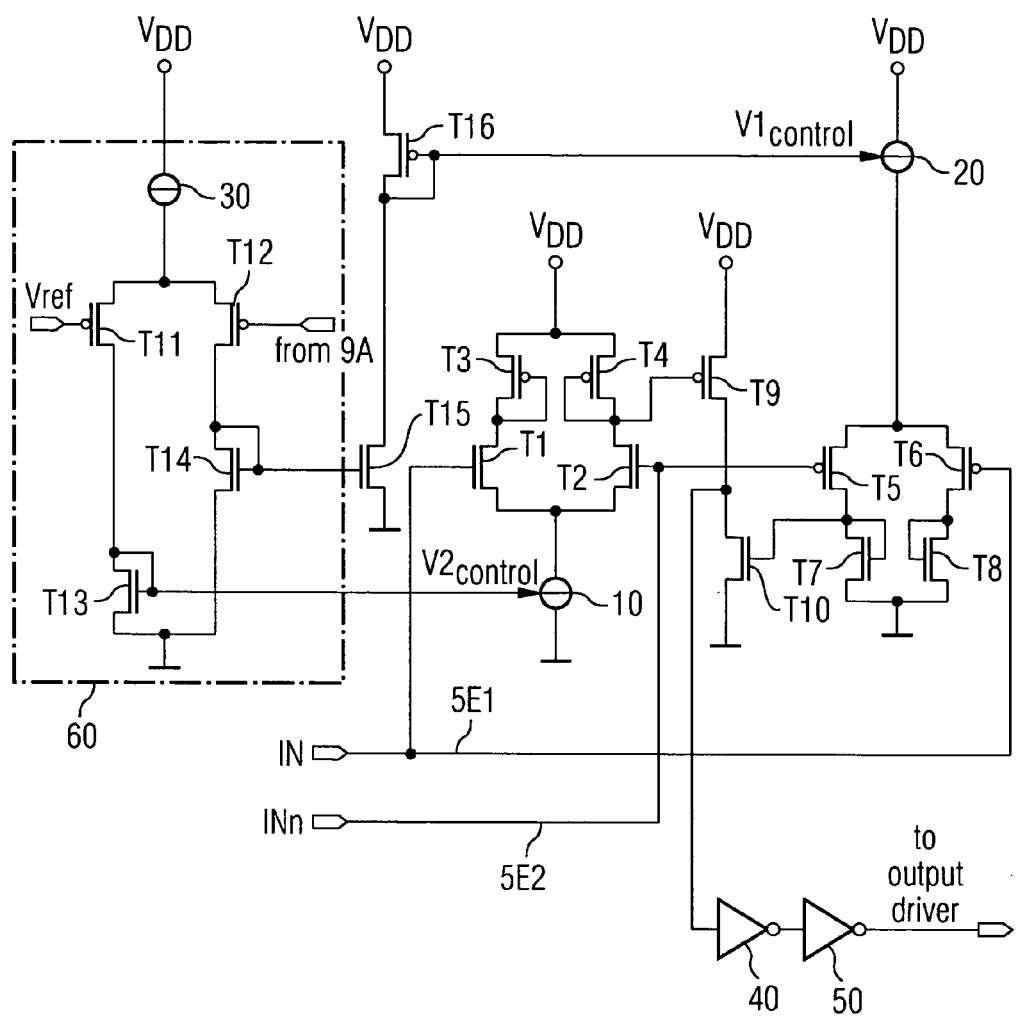
FIG. 2 shows an exemplary embodiment of the differential stage from FIG. 1.

FIG. 2 shows the differential stage 5. It comprises a circuit part 60 which is subsequently referred to as a current balance and also two comparators which are respectively supplied with current by a controlled current source 10, 20.

A description will first be given of the design of the two comparators and also of the adjoining circuit parts.

The two comparators are respectively formed by two input differential amplifiers having two respective transistors T1, T2 and T5, T6. The transistors T1, T2 are N-channel FET (field effect transistor) transistors, and the transistors T5, T6 are P-channel FET transistors. The source connections of the two transistors T1, T2 are connected together and are connected to a current source 10 which can be regulated by means of a voltage $V2_{CONTROL}$ and whose other end is connected to ground. The regulatable current source is an FET transistor, for example, with the gate voltage $V2_{CONTROL}$ being able to be used to set the current in the current source and hence through the differential amplifier.

Correspondingly, the source connections of the transistors T5, T6 in the second input differential amplifier are connected to the operating voltage $V_{DD}$ via a voltage $V1_{CONTROL}$ regulatable current source 20.

Consideration will first be given to the first input differential amplifier. One transistor T1 in the differential amplifier has a P-channel FET transistor T3 connected in series with it, which provides an active load. Similarly, the other transistor T2 in the input differential amplifier has a P-channel FET transistor T4 connected in series with it, which likewise provides an active load. The source connections of the transistors T3, T4 are connected to the operating voltage $V_{DD}$, and the drain connections of the transistors T3, T4 are connected to the drain connections of the transistors T1, T2.

In addition, a further transistor T9 is used to provide a current mirror. The transistor T9 is a P-channel FET transistor whose source connection is connected to the positive operating voltage. The gate connection of the transistor T9 is connected to the gate connection of the transistor T4. At the same time, the gate connection of the transistor T4 is connected to the drain connection of the transistor T2. An inherently known current mirror circuit is provided.

The current mirror operates in the following manner: the current flowing through the transistor T2 is a reference current for the current mirror, which flows through the transistor T4. The current mirror now produces a control current which is in a particular ratio to the reference current and which flows through the transistor T9.

A mirror image symmetrical design for a current mirror circuit is formed using the transistors T5, T6, T7, T8 and T10 in the case of the second input differential amplifier. The transistors T7, T8 and T10 are each N-channel FET transistors. The drain connection of the transistor T10 is connected to the drain connection of the transistor T9.

Two input terminals 5E1, 5E2 are used to supply the two input differential amplifiers with an input signal which comprises a sequence of high and low voltage signals, the input signal possibly being of poor quality and not having the desired duty cycle, in particular. The two input differential stages are controlled by the input signal such that a high signal causes one of the transistors T2, T5 to be on, while the other is off, and a low signal causes the other of the transistors T5, T2 to be on, while the other transistor is off. By way of example, a high signal causes a current to flow through the transistors T2, T4 and hence also through one transistor T9 in the mirror circuit. At the same time, the transistor T5 in the other input differential amplifier is off.

When a low signal is present, the transistor T2 in the first input differential amplifier is off, while the transistor T5 in the second input differential amplifier is on, so that a current flows through the transistors T5, T7 and hence also through the transistor T10 in the mirror circuit.

Between the transistors T9 and T10, a voltage is tapped off. This voltage fluctuates between a low value and a high value in line with the currents, provided by means of the current sources 10, 20, through the respective input differential amplifiers which determine the currents through the mirror circuits and the transistors T9, T10. If the transistor T9 is on, the transistor T10 is off, and vice versa, which means that alternately a voltage close to or equal to $V_{DD}$ and close to or equal to the ground voltage is tapped off between the two transistors T9, T10.

The voltage signal tapped off is supplied to a digital regenerator device, which in the present case comprises two invertors 40, 50 connected one behind the other. The regenerator device converts the voltage signal tapped off into a digital output signal and supplies this signal to the output of the differential stage. In this arrangement, each invertor has a comparator which compares the input signal with a switching threshold and outputs a digital output signal. Unlike the signal which is tapped off between the transistors T9, T10, the digital signal meets particular requirements in terms of signal quality, particularly in terms of the constancy of the signal amplitude, its gradient and jitter. In principle, the regenerator device 40, 50 may be provided with or without signal inversion.

The design of the control device 60 referred to as a current balance is now discussed, said control device being used to apply the control signals $V1_{CONTROL}$, $V2_{CONTROL}$ to the current sources 10, 20 for the two comparators.

The current balance 60 has a current source 30, which is connected to the operating voltage, and also two current arms containing a total of four transistors T11, T12, T13, T14. The transistors T11, T13 in one arm are connected in series and are formed by an N-channel FET transistor T13 and a P-channel FET transistor T11. In addition, the transistors T12, T14 in the other arm are connected in series, with one transistor T14 being formed by an N-channel FET transistor, and the transistor T12 being formed by a P-channel FET transistor. The source connections of the transistors T13, T14 are connected together and are connected to ground. Similarly, the source connections of the P-channel transistors T11, T12 are connected together and are connected to the current source 30.

The transistor T13 in one arm of the current balance 60 forms a mirror circuit together with the current source 10 for one comparator. The current through the transistor T13 is thus also used to set the current through the current source 10.

The transistor T14 in the other arm of the current balance 60 forms a mirror circuit with a transistor T15, the latter likewise forms a mirror circuit with a further transistor T16, and the transistor T16 forms a mirror circuit with the current source 20 for the further comparator. The current mirrors cause the current through the transistor T14 to set the current through the current source 20.

The gate connection of the transistor T11 has a constant reference voltage $V_{REF}$ applied to it. The gate voltage of the transistor T12 contains the controlled variable which is provided at the output 9A of the regulating device 8, 9.

Ideally, when the duty cycle has been leveled to 50% and the voltage divider 96, 97 provides the value VDD/2 at the noninverting input 91E2 of the operational amplifier 91, the voltage $V_{REF}$ and the output voltage from the regulating device 8, 9 are preferably the same. For a level signal, the same voltages are thus applied to the gate connections of the transistors T11, T12, so that the same level of current flows through the two arms of the current balance and accordingly the current sources 10, 20 for the comparators provide current for the comparators in the same way. Depending on the design of the transistors, however, it is also possible, in principle, for there to be a different voltage on the transistors T11, T12.

It will now be assumed that the duty cycle is not at the desired 50%. By way of example, the on/off ratio or the 1/0 ratio is 60%. This initially results in the signal E8 rising at the output of the first integrator 8, i.e. the mean value about which the output signal swings is higher. This higher signal, whose mean value is thus greater than VDD/2, is supplied to the inverting input 91E1 of the operational amplifier. There is now a difference with respect to the reference signal at the input 91E2, which is VDD/2. Accordingly, a control signal is output at the output 9A of the second integrator, which control signal attempts to regulate this difference to zero. The changed output signal from the second integrator 9A results in the gate voltage of the transistor T12 falling. As a result, the current in the arm with the transistors T12, T14 is increased. Accordingly, the current in the arm with the transistors T11, T13 falls. As a result of the current mirrors, this causes the control voltages which are supplied to the current sources 10, 20 for the comparators likewise to change. This increases the current through one comparator while the current through the other comparator is reduced. However, this results in the rising and falling edges of the signal from one comparator being accelerated and the rising and falling edges of the signal from the other comparator being decelerated.

The currents can thus be used to set the speed of the input differential stages and hence also the rise and fall times at the output of the differential stage. By way of example, an increased current on the current source 10 for the first input differential amplifier causes an increase in the speed of the first input differential amplifier, while the response is the reverse for the other current source 20 and the other input differential amplifier. The result of regulation is that the duty cycle is set to a value of 50%.

The feedback loop is used for regulation until the duty cycle has been set to the desired value of 50%.

For the rest, the following points are made:

The basis for operation of the circuit arrangement is a voltage input signal. When a current input signal is used, a current/voltage converter therefore additionally needs to be used at the input of the circuit arrangement. The input signal may be either single-ended or differential. With differential actuation, mutually inverted input signals are applied to the two input terminals 1, 2. In the case of single phase (single-ended) actuation, a data signal is applied just to one input terminal. For this case, the other input terminal needs to be supplied with a corresponding reference voltage.

The circuit apparatus described in the present case is preferably designed using CMOS technology. In an equivalent manner, however, corresponding circuits may also be produced using bipolar technology and BiCMOS technology.

The configuration of the invention is not limited to the exemplary embodiments illustrated above. The person skilled in the art will recognize that numerous alternative variant embodiments exist which, despite their departure from the exemplary embodiment described, make use of the teaching which is defined in the subsequent claims.

We claim:

1. A circuit arrangement for regulating a parameter of an electrical signal, the circuit arrangement comprising:
    a circuit component for generating an electrical output signal having an electrical parameter which is to be regulated, and
    a regulating device including:
        a first integrator for receiving the electrical output signal from the circuit component, and for producing a first output signal, and
        a second integrator connected to receive the first output signal from
    the first integrator, wherein the second integrator comprises an operational amplifier having an inverting input terminal, a noninverting input terminal and an output terminal, wherein the output terminal is connected to the inverting input terminal via a feedback path,
    wherein the inverting input terminal is connected to receive the first output signal from the first integrator,
    wherein the noninverting input terminal is connected to receive a reference signal representing a nominal value,
    wherein the output terminal of the operational amplifier is fed back to the inverting input terminal in the feedback path via a series circuit comprising a capacitor and a resistor,
    wherein the output terminal of the operational amplifier provides a second output signal from the regulating device,
    wherein the second output signal from the regulating device is supplied to the circuit component as a controlled variable, and
    wherein the circuit component comprises a differential stage which produces a digital output signal having a duty cycle that is regulated by the second output signal generated by the circuit arrangement.

2. The circuit arrangement according to claim 1 wherein the first integrator comprises a low pass filter.

3. The circuit arrangement according to claim 1 further comprising a resistive voltage divider for providing the reference signal applied to the noninverting input terminal.

4. The circuit arrangement according to claim 1, wherein the differential stage comprises:
    a first comparator connected to receive input signals,
    a first current source for controlling a first current through the first comparator,
    a second comparator, which is of complementary design to the first comparator and is connected to receive the input signals,
    a second current source for controlling a second current, through the second comparator,
    a device for receiving the first and second currents in the first and second comparators and for producing a fluctuating voltage signal of fluctuating level,
    a regenerator device for converting the fluctuating voltage signal into a digital output signal, and for supplying the digital output signal to an output terminal, and
    a control device, connected to receive the second output signal from the regulating device, for producing first and second control signals, the first control signal being supplied to the first current source and the second control signal being is supplied to the second current source,
    wherein the first current source and the second current source respectively use the first and second control signals as a basis for regulating the first current through the first comparator and the second current through the second comparator such that the duty cycle of the output signal from the circuit component is set to a stipulated value.

5. The circuit arrangement according to claim 4 wherein the first and second current sources are regulated in opposite senses.

6. The circuit arrangement according to claim 4 wherein the first comparator comprises a first input differential amplifier having two transistors, and the second comparator comprises a second input differential amplifier having two transistors.

7. The circuit arrangement according to claim 6 wherein the first input differential amplifier comprises first and second n-channel FET transistors, and wherein the first current source is connected between ground and source connections of the first and second transistors in the first input differential amplifier.

8. The circuit arrangement according to claim 6 wherein the second input differential amplifier comprises first and second p-channel FET transistors, and wherein the second current source is connected between an operating voltage and source connections of the first and second transistors in the second input differential amplifier.

9. The circuit arrangement according to claim 4 where the device which takes the currents in the two input differential amplifiers and produces a voltage signal of fluctuating level comprises first and second current mirror circuits which respectively have a current mirror comprising a first current mirror transistor and a second current mirror transistor, wherein one of said first and second current mirror transistors of the first current mirror circuit is connected to one of said first and second current mirror transistors of the second current mirror circuit, and where the voltage signal of fluctuating level is tapped off between the connected two transistors.

10. The circuit arrangement according to claim 4 where the control device comprises first and second current-carrying arms, where a first current through the first arm is stipulated by a reference signal and a second current through the second arm is stipulated by the controlled variable from the regulating device, and wherein an amount of current through each of the first and second arms is used as a basis for supplying a respective control signal to the first current source and to the second current source.

11. The circuit arrangement according to claim 10 wherein the control signal is a control voltage.

12. The circuit arrangement according to claim 10 wherein each of the first and second current-carrying arms of the control device comprises an n-channel FET transistor and a p-channel FET transistor which are connected in series.

13. The circuit arrangement according to claim 12 where one of the transistors in each of the first and second arms is coupled to one of the current sources for the comparators via at least one current mirror.

14. The circuit arrangement according to claim 1, where the circuit component further comprises an output amplifier connected between the differential stage and the first integrator of the regulating device.

15. A circuit arrangement comprising:
a control element for generating a single-ended electrical output signal on an output terminal in response to a differential input signal; and
a regulating device including:
an operational amplifier having an inverting in put terminal, a noninverting input terminal connected to receive a reference signal, an output terminal, and a feedback path connected between the output terminal and the inverting input terminal and
an integrator connected between the output terminal of the control element and the inverting input terminal of the operational amplifier,
wherein said feedback path of the operational amplifier comprises a capacitor and a resistor connected in series,
wherein the output terminal of the operational amplifier is connected to the control element, whereby a controlled variable signal is transmitted from the regulating device to the control element, and
wherein the control element comprises means for adjusting a duty cycle of the single-ended electrical output signal in response to the controlled variable signal.

16. The circuit arrangement according to claim 15 wherein integrator comprises a resistor connected between the output terminal of the control element and the inverting input terminal of the operational amplifier, and a capacitor connected between a terminal of the resistor and ground.

17. The circuit arrangement according to claim 15 wherein the control element includes a differential stage comprising:
a first comparator connected to receive the differential input signal,
a first current source connected between a system voltage source and the first comparator for controlling a first current through the first comparator,
a second comparator connected to receive the differential input signal,
a second current source connected between ground and the second comparator for controlling a second current through the second comparator,
means for generating a fluctuating voltage signal having a fluctuating voltage level in response to the first and second currents,
a regenerator device for converting the fluctuating voltage signal into a digital output signal, and for supplying the digital output signal to an output terminal, and
a control device, connected to receive the controlled variable signal
from the regulating device, for producing first and second control signals, the first control signal being supplied to the first current source and the second controls signal being is supplied to the second current source,
wherein the first current source and the second current source regulate the first current through the first comparator and the second current through the second comparator in response to the first and second controls signals such that the duty cycle of the digital output signal from the circuit component is set to a stipulated value.

* * * * *